(12) United States Patent
Ponomarev et al.

(10) Patent No.: US 6,544,851 B2
(45) Date of Patent: Apr. 8, 2003

(54) METHOD OF MANUFACTURING A SEMICONDUCTOR DEVICE HAVING A POCKET IMPLANT IN CHANNEL REGION

(75) Inventors: Youri Ponomarev, Eindhoven (NL); Marian Nelia Webster, Eindhoven (NL); Charles Johan Joachim Dachs, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/784,421

(22) Filed: Feb. 15, 2001

(65) Prior Publication Data

US 2001/0016392 A1 Aug. 23, 2001

(30) Foreign Application Priority Data

Feb. 17, 2000 (EP) .............................. 00200540
Mar. 2, 2000 (EP) .............................. 00200738

(51) Int. Cl.[7] ............................................ H01L 21/336
(52) U.S. Cl. .................... 438/289; 438/291; 438/303
(58) Field of Search ............................. 438/299–307, 438/289–291

(56) References Cited

U.S. PATENT DOCUMENTS

| 4,173,818 A | 11/1979 | Bassous et al. ............. 29/571 |
| 5,534,447 A | 7/1996 | Hong ......................... 437/27 |
| 5,899,719 A | * 5/1999 | Hong ......................... 438/270 |
| 5,940,710 A | 8/1999 | Chung et al. ............... 438/305 |
| 5,960,270 A | * 9/1999 | Misra et al. ................ 438/197 |

OTHER PUBLICATIONS

"Sub–100nm Gate Length Metal Gate NMOS Transistors Fabricated by a Replacement gate Process", by A. Chatterjee et al., IEDM 1997, pp. 821–824.

* cited by examiner

Primary Examiner—Jey Tsai
(74) Attorney, Agent, or Firm—Aaron Waxler (57) ABSTRACT

In a method of manufacturing a semiconductor device comprising a semiconductor body (1) of a first conductivity type which is provided at a surface (2) with a transistor having a gate (28) insulated from a channel (13) provided at the surface (2) of the semiconductor body (1) by a gate dielectric (26), a structure is provided on the surface (2) comprising a dielectric layer (14) having a recess (16), which recess (16) is aligned to a source zone (11,9) and a drain zone (12,9) of a second conductivity type provided at the surface (2) of the semiconductor body (1) and has side walls (17) extending substantially perpendicularly to the surface (2) of the semiconductor body (1). In this recess (16), a double-layer (20) is applied consisting of a second sub-layer (19) on top of a first sub-layer (18), which second sub-layer (19) is removed over part of its thickness until the first sub-layer is exposed, which first sub-layer (18) is selectively etched with respect to the second sub-layer (19) and the side walls (17) of the recess (16) to a depth, thereby forming trenches (21) extending substantially perpendicularly to the surface (2) of the semiconductor body (1). Via these trenches (21) impurities of the first conductivity type are introduced into the semiconductor body (1), thereby forming pocket implants (22).

16 Claims, 10 Drawing Sheets

METHOD OF MANUFACTURING A SEMICONDUCTOR DEVICE HAVING A POCKET IMPLANT IN CHANNEL REGION

BACKGROUND OF THE INVENTION

The invention relates to a method of manufacturing a semiconductor device comprising a semiconductor body of a first conductivity type which is provided at a surface with a transistor having a gate insulated from a channel provided at the surface of the semiconductor body by a gate dielectric.

Such a method is known from U.S. Pat. No. 5,534,447. In the known method a shielding layer of, for example, silicon oxide provided with an opening is applied to the surface of the semiconductor body of the first conductivity type, the opening having side walls defining the channel of the transistor. The side walls of the opening are provided with side wall spacers of, for example, silicon nitride. The surface of the semiconductor body, which is confined by the side wall spacers, is provided with the gate dielectric, to which a conductive layer of, for example, polycrystalline silicon is applied providing the gate of the transistor. The side wall spacers are then removed, thereby forming trenches which are confined by the gate and the shielding layer, via which trenches impurities of the first and a second, opposite conductivity type are introduced into the semiconductor body. The shielding layer is removed and the surface of the semiconductor body is provided with a source zone and a drain zone of the second conductivity type.

A disadvantage of the known method is that the introduction of the impurities via the trenches takes place prior to the formation of the source zone and the drain zone. As the formation of the source zone and the drain zone is associated with a high-temperature anneal with temperatures as high as about 1000° C., the impurities previously introduced via the trenches are adversely redistributed, which adversely affects the performance of the transistor.

SUMMARY OF THE INVENTION

It is an object inter alia of the invention to provide a method of manufacturing a semiconductor device, which allows a local introduction of impurities via the trenches into the semiconductor body without adversely redistributing the locally introduced impurities in a later stage of the process.

According to the invention, this object is achieved in that a structure is provided on the surface, which structure comprises a dielectric layer having a recess, which recess is aligned to a source zone and a drain zone of a second conductivity type provided at the surface of the semiconductor body and has side walls extending substantially perpendicularly to the surface of the semiconductor body, in which recess a double-layer is applied consisting of a second sub-layer on top of a first sub-layer, which second sub-layer is removed over part of its thickness until the first sub-layer is exposed, which first sub-layer is selectively removed with respect to the second sub-layer and the side walls of the recess to a depth, thereby forming trenches extending substantially perpendicularly to the surface of the semiconductor body, via which trenches impurities of the first conductivity type are introduced into the semiconductor body, thereby forming pocket implants.

The above-stated measures in accordance with the invention prevent the impurities, which have been locally introduced into the semiconductor body via the trenches, from being exposed to the high temperatures of the anneal associated with the formation of the source zone and the drain zone. In this way, a redistribution of the locally introduced impurities is counteracted.

The structure comprising the dielectric layer having the recess aligned to the source zone and the drain zone may be obtained by providing the surface of the semiconductor body with a source zone and a drain zone, and subsequently providing it with a dielectric layer having a recess aligned to the source zone and the drain zone. Clearly, a large accuracy is needed to make sure that the recess is provided so as to be aligned to the source zone and the drain zone. A preferred embodiment of the method in accordance with the invention is therefore characterized in that, in order to provide the structure, a patterned layer is applied at the area of the planned gate, and the source zone and the drain zone of the second conductivity type are formed in the semiconductor body while using the patterned layer as a mask, after which the dielectric layer is provided in such a way, that the thickness of the dielectric layer next to the patterned layer is substantially equally large or larger than the height of the patterned layer, which dielectric layer is removed over part of its thickness by means of a material removing treatment until the patterned layer is exposed, after which the patterned layer is removed, and the recess is provided so as to be aligned to the source zone and the drain zone. In this way, the recess is provided in a self-aligned way with respect to the source zone and the drain zone. Further advantageous embodiments of the method in accordance with the invention are described in other dependent claims.

BRIEF DESCRIPTION OF THE DRAWING

These and other aspects of the invention will be apparent from and be elucidated with reference to the embodiments described hereinafter and shown in the drawing. In the drawing.

DESCRIPTION OF THE PREFERRED EMBODIMENTS

Although the invention is illustrated hereinafter on the basis of a MOS transistor, it will be evident to those skilled. in the art that the invention may also be advantageously applied in the manufacture of a MOS transistor with a floating gate, also referred to as floating gate transistor, or of CMOS and BICMOS integrated circuits known per se.

FIGS. 1 to 13 show in diagrammatic cross-sectional views successive stages in the manufacture of a semiconductor device, using a first embodiment in accordance with the invention.

The process starts (FIG. 1) with a low-doped semiconductor body 1 of a first conductivity type, in the present example a silicon body of, for example, a p-type conductivity of, for example $1.10^{15}$ cm$^{-3}$. The semiconductor body 1 is provided at a surface 2 with relatively thick oxide field insulating regions 3, which are at least partly recessed in the semiconductor body 1 and which define an active region 4 in which a transistor, in the present example an n-channel MOS transistor, is to be manufactured. The thick oxide insulating regions 3 are formed in a usual way by means of LOCOS (LOCal Oxidation of Silicon) or STI (Shallow Trench Isolation). Subsequently, the surface 2 of the semiconductor body 1 is provided with a layer 5 composed of, for example, silicon oxide, which is covered by a patterned layer 8 at the area of a gate planned to be provided in a later stage of the process, that is to say at the area of a planned gate. In the present example, the patterned layer 8 is obtained by depositing a double-layer consisting of a first sub-layer 6 of, for example, polycrystalline silicon which may be doped with a dopant such as phosphorus or possibly boron, and on top thereof, a second sub-layer 7 composed of, for example, silicon nitride, and by patterning the double-layer for example in a usual lithographic way. Instead of silicon nitride any other suitable material such as, for example, aluminum oxide or a combination of materials can be used. Instead of polycrystalline silicon, amorphous silicon or polycrystalline $Si_xGe_{1-x}$ may be used, with x representing the fraction of silicon lying in the range between 0 and 1. It is to be noted that the patterned layer may be a single layer as well, composed of polycrystalline silicon, amorphous silicon or polycrystalline $Si_xGe_{1-x}$, or any other suitable refractory material such as, for example, silicon nitride or aluminum oxide. Furthermore, the presence of the layer 5, which may have been advantageously applied in order to protect the semiconductor body against contamination and/or etching, is not necessary. After applying the patterned layer 8, source/drain extensions 9 of a second, opposite conductivity type, in the present example n-type conductivity, are formed on opposite sides of the patterned layer 8 by means of a self-aligned ion implantation of a relatively light dose of, for example, phosphorus or arsenic using the patterned layer 8 together with the oxide field insulating regions 3 as a mask.

Figure 1:
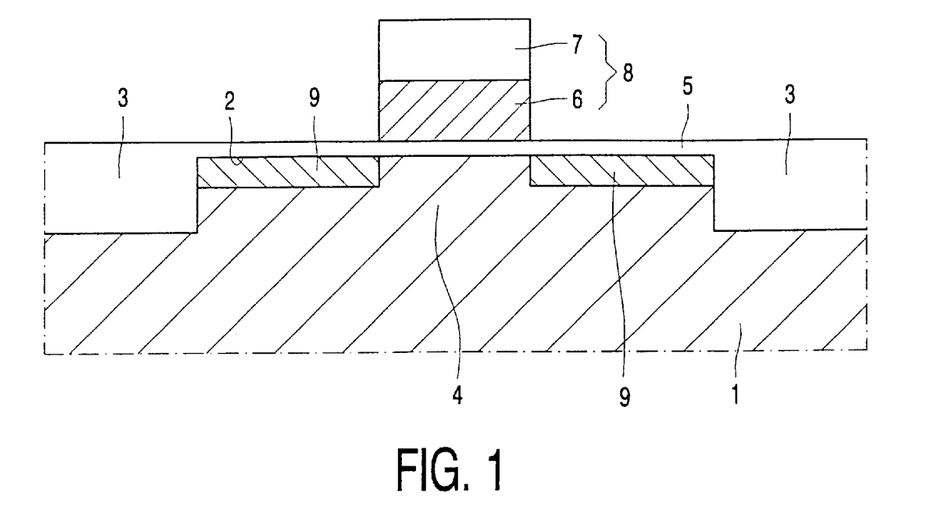
FIGS. 1 to 13 show in diagrammatic cross-sectional views successive stages in the manufacture of a semiconductor device, using a first embodiment of the method in accordance with the invention.
Figure 2:
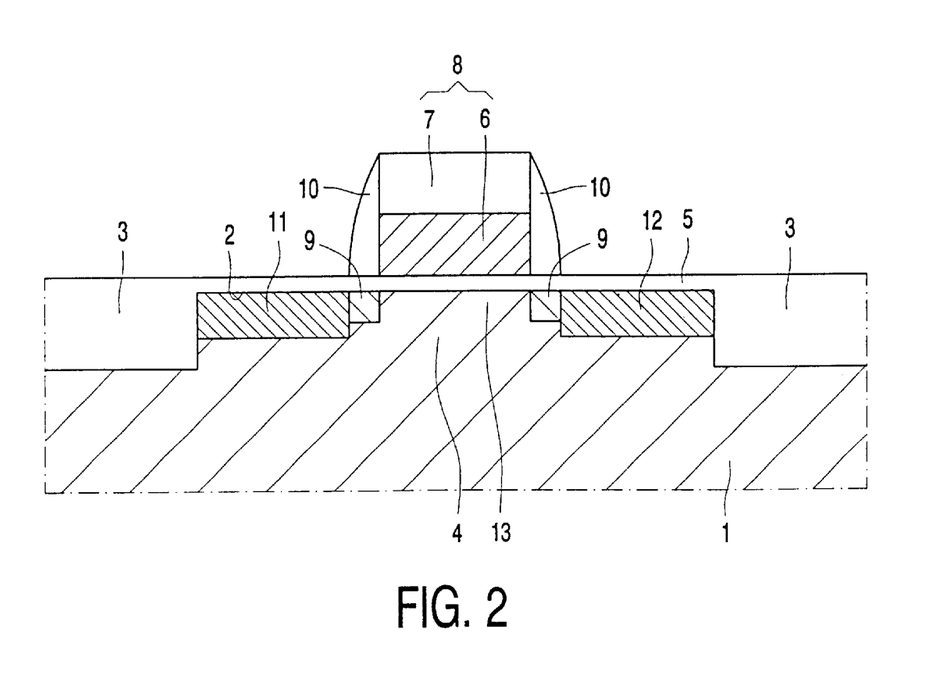

Subsequently, the patterned layer 8 is provided with side wall spacers 10, for example in a known way, such as by means of deposition and anisotropic etch-back of a silicon oxide layer (FIG. 2). After formation of the side wall spacers 10, a highly-doped source zone 11 and drain zone 12 of the second conductivity type, in the present example n-type conductivity, are formed on opposite sides of the side wall spacers 10 by means of a self-aligned ion implantation of a heavier dose of, for example, phosphorus or arsenic using the oxide field insulating regions 3 together with the patterned layer 8 and the side wall spacers 10 as a mask. The ion implantation of the source zone 11 and the drain zone 12 is accompanied by an anneal at temperatures as high as about 1000° C. in order to activate the as-implanted impurities and repair the implantation damage in the lattice of the semiconductor body 1. It is to be noted that a channel 13 is provided at the surface 2 of the semiconductor body 1, which channel 13 extends between the extended source zone 11,9 and the extended drain zone 12,9.

Figure 3:
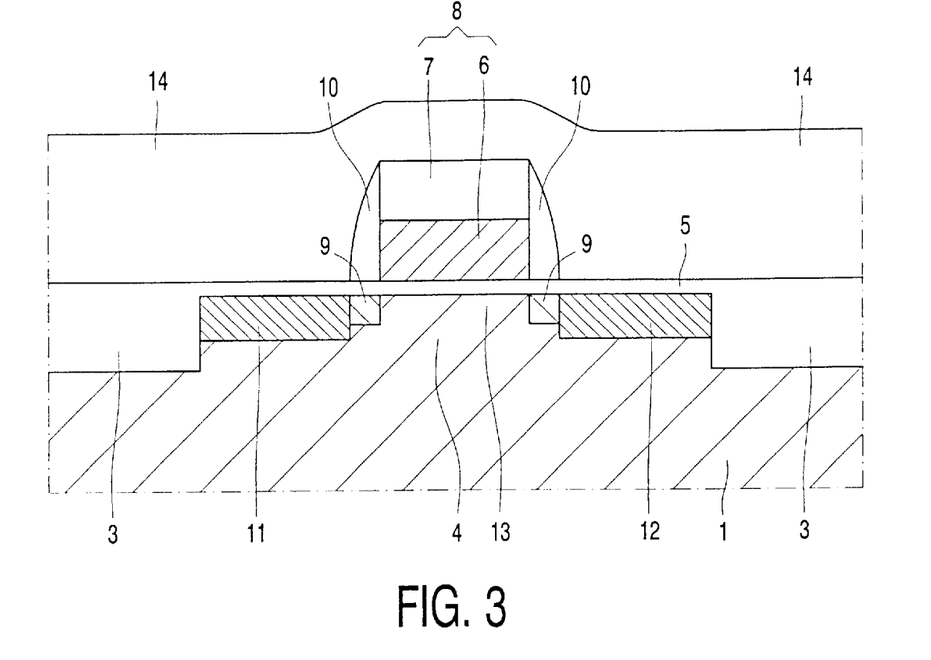

With reference to FIG. 3, a relatively thick dielectric layer 14, in the present example composed of silicon oxide, is applied in such a way, that the thickness of the dielectric layer 14 next to the patterned layer 8 is substantially equally large or larger than the height of the patterned layer 8. Obviously, other suitable electrically insulating materials such as PSG (phosphosilicate glass) or BPSG (borophosphosilicate glass) may also be used.

Figure 4:
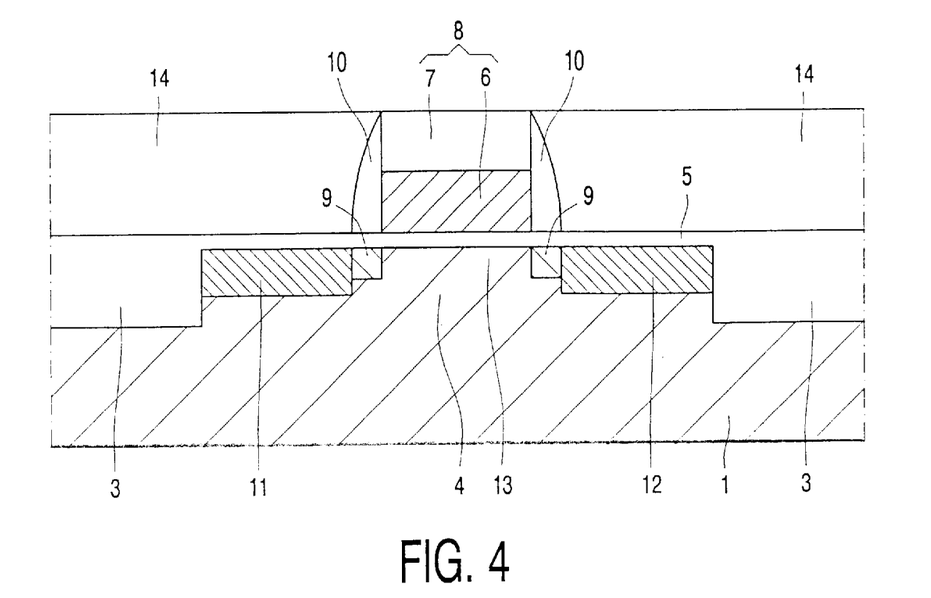

Subsequently, the dielectric layer 14 is removed over a part of its thickness until the patterned layer 8 is exposed (FIG. 4). This can be accomplished by means of, for example, chemical-mechanical polishing (CMP) e.g. using a commercially available slurry. During the material removing treatment, the second sub-layer 7, in the present example composed of silicon nitride, will act as a stopping layer.

Figure 5:
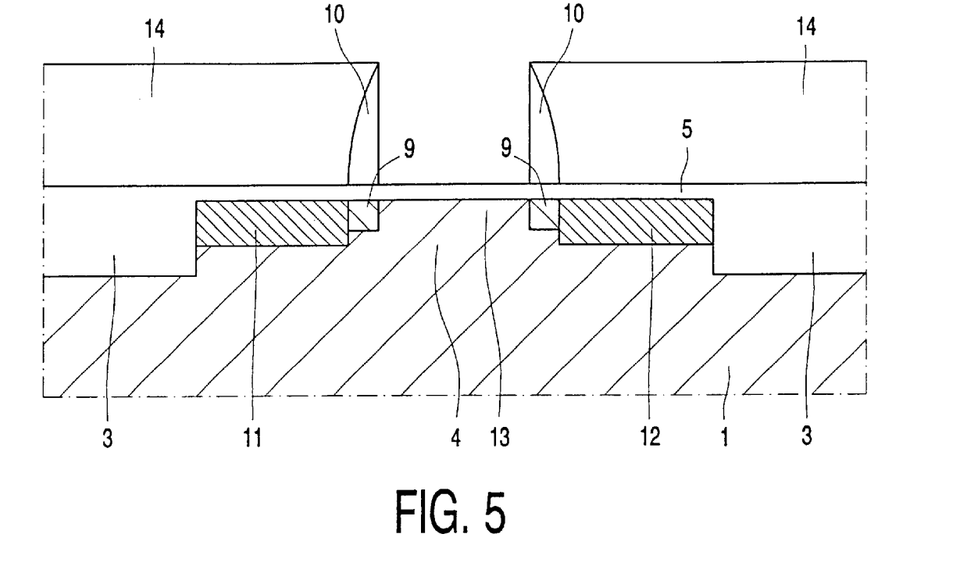
Figure 6:
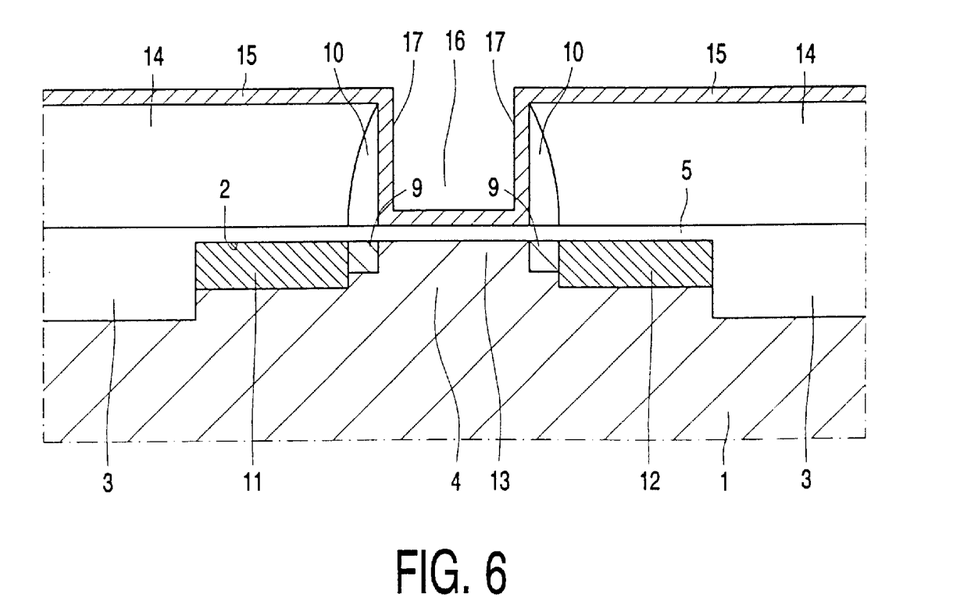

With reference to FIG. 5, the second sub-layer 7 and the first sub-layer 6 are removed in two separate etching steps. The second sub-layer 7, which is composed of silicon nitride in the present example, can be selectively removed by means of, for example, wet etching using a mixture of hot phosphoric acid and sulphuric acid. The first sub-layer 6, in the present example composed of polycrystalline silicon, can be selectively removed by means of wet etching using, for example, a hot KOH solution or by means of plasma etching with, for example, a $HBr/Cl_2$ mixture. The layer 5, in the present example composed of silicon oxide, is kept in place in order to protect the semiconductor body against contamination and/or etching. It may, however, be removed by means of a dip-etch using HF.

In a next step (FIG. 6), an additional layer 15, in the present example composed of polycrystalline silicon, is applied in a usual way. A recess 16 is thus formed, the recess 16 being aligned to the extended source zone 11,9 and the extended drain zone 12,9 and having side walls 17 extending substantially perpendicularly to the surface 2 of the semiconductor body 1. The side walls 17 of the recess 16 are thus provided by the additional layer 15.

Figure 7:
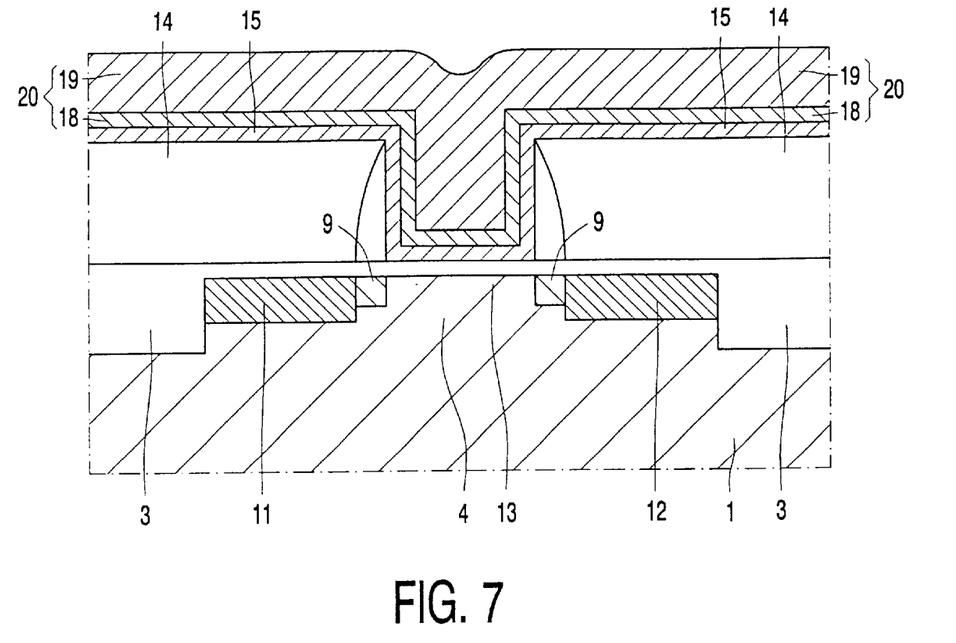
Figure 8:
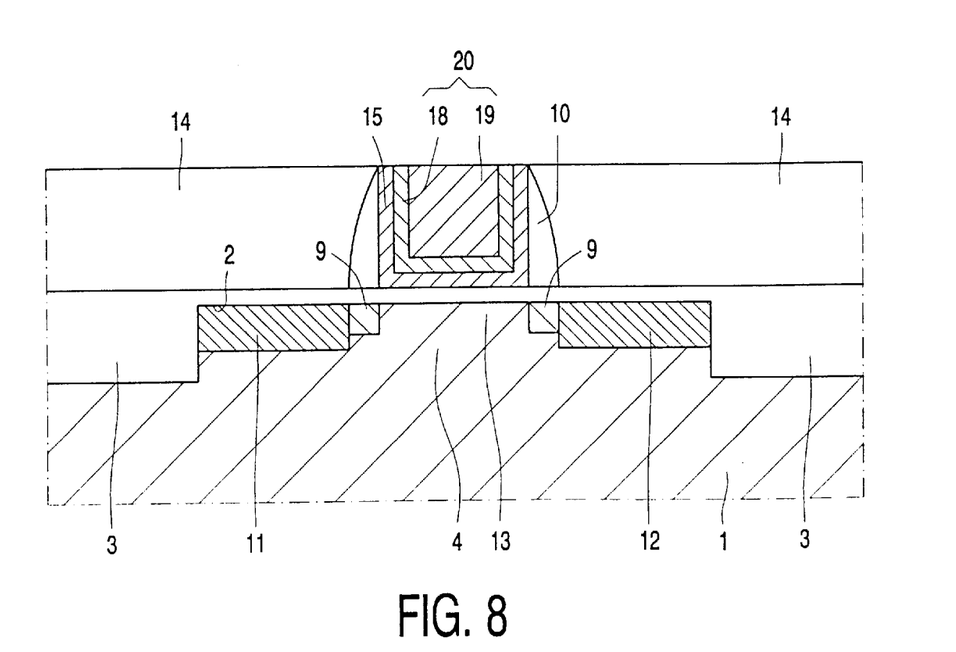

With reference to FIG. 7, a double-layer 20 is applied in a usual way, the double-layer 20 consisting of a second sub-layer 19 on top of a first sub-layer 18. In the present example, the first sub-layer 18 is composed of a polycrystalline silicon germanium alloy $Si_xGe_{1-x}$, with x representing the fraction of silicon lying in the range between 0 and 1, whereas the second sub-layer 19 is composed of polycrystalline silicon.

It is important that the materials of the additional layer 15, the first sub-layer 18, and the second sub-layer 19 are chosen such that the first sub-layer 18 can be selectively etched with respect to the additional layer 15 as well as with respect to the second sub-layer 19. It will be clear that other materials can also be used instead of those mentioned above. By way of example, the additional layer 15 and the second sub-layer 19 are composed of, for example, aluminum, whereas the first sub-layer 18 is composed of, for example, silicon nitride. It is clear that the additional layer 15 and the second sub-layer 19 do not have to be composed of the same material.

In a next step (FIG. 8), the second sub-layer 19 is removed over part of its thickness, in a maskless process, until the first sub-layer 18 is exposed. Then, the first sub-layer 18 and the additional layer 15 are removed in a maskless process, thereby exposing the dielectric layer 14. The maskless removal of any one of these layers can be accomplished by means of, for example, chemical-mechanical polishing (CMP) e.g. using a commercially available slurry. It should be noted, however, that maskless removal of the first sub-layer 18 and the additional layer 15 is not required in this stage of the process, as these layers will be removed in a later stage of the process (see FIGS. 9,10) anyhow.

Figure 9:
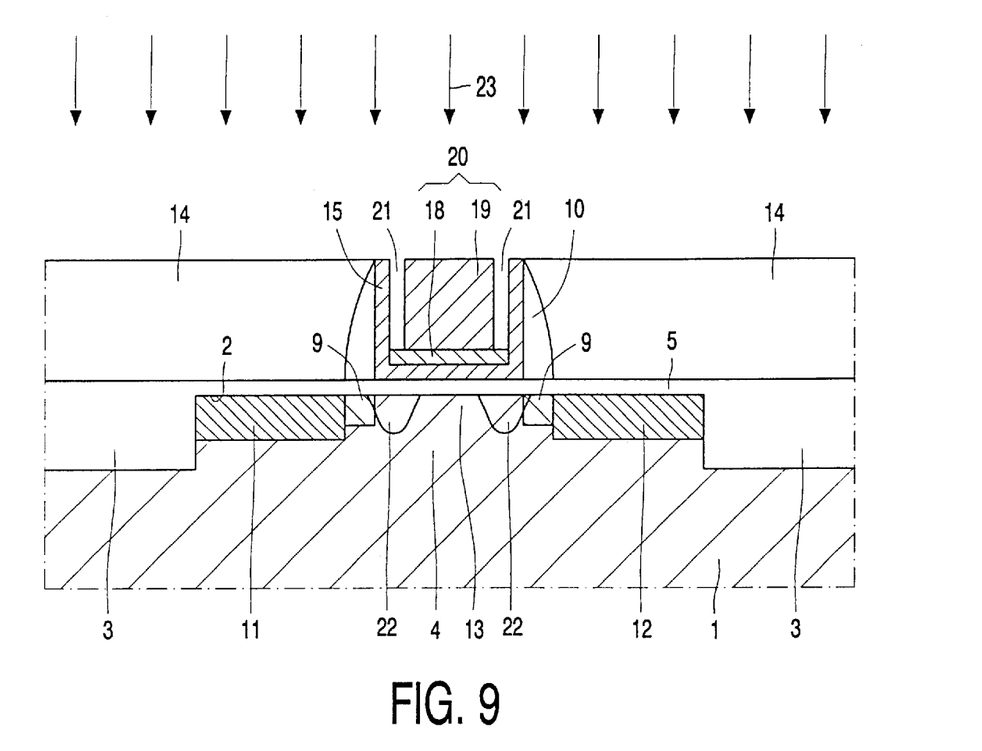

With reference to FIG. 9, the first sub-layer 18, in the present example composed of a polycrystalline silicon germanium alloy $Si_xGe_{1-x}$, is selectively etched with respect to the second sub-layer 19 and the additional layer 15, which are both composed of polycrystalline silicon in the present example. This can be accomplished by means of anisotropic plasma etching using a HBr/HCl mixture or by means of wet etching using a $HNO_3:H_2O:dHF(0.08\%HF)$ mixture in a ratio of, for example, 35:20:10. As a result of selectively etching the first sub-layer 18, to a certain depth, trenches 21 are formed, which trenches 21 extend substantially perpendicularly to the surface 2 of the semiconductor body 1. In a next step, the semiconductor body 1 is provided with pocket implants 22 of the first conductivity type, in the present example p-type conductivity, by introducing p-type impurities such as, for example, boron (B) or indium (In) via the trenches 21 into the semiconductor body 1 in a self-registered way. The introduction of the p-type impurities is advantageously carried out by means of ion implantation as depicted by arrows 23, which ion implantation is accompanied by, for example, a rapid thermal anneal (RTA) treatment at, for example, about 900° C. for, for example, about 10 seconds in order to activate the as implanted impurities. In this respect, boron may be implanted at an energy lying in the range of about 2 to 20 keV and in a dose of about $5.10^{13}$ atoms/cm$^2$, whereas indium may be implanted at an energy lying in the range of about 7 to 150 keV and in a dose of about $5.10^{13}$ atoms/cm$^2$. It is understood by those skilled in the art that antimony (Sb) or arsenic (As) may be implanted in a p-channel MOS transistor for similar reasons. For example, antimony may be implanted at an energy lying in the range of about 6.5 to 155 keV and in a dose of about $5.10^{13}$ atoms/cm$^2$, whereas arsenic may be implanted at an energy lying in the range of about 6 to 110 keV and in a dose of about $5.10^{13}$ atoms/cm$^2$. In order to allow extra channeling of the impurities along crystal directions and planes of the semiconductor body 1, the ion implantation is advantageously carried out substantially perpendicularly to the surface 2 of the semiconductor body 1.

It is to be noted that the impurities are introduced into the semiconductor body 1 via the trenches 21 after the formation of the source zone 11 and the drain zone 12 and, hence, after the high temperature anneal associated with the formation of the source zone and the drain zone. As a consequence, a redistribution of the impurities, which have been introduced via the trenches, is counteracted.

Figure 10:
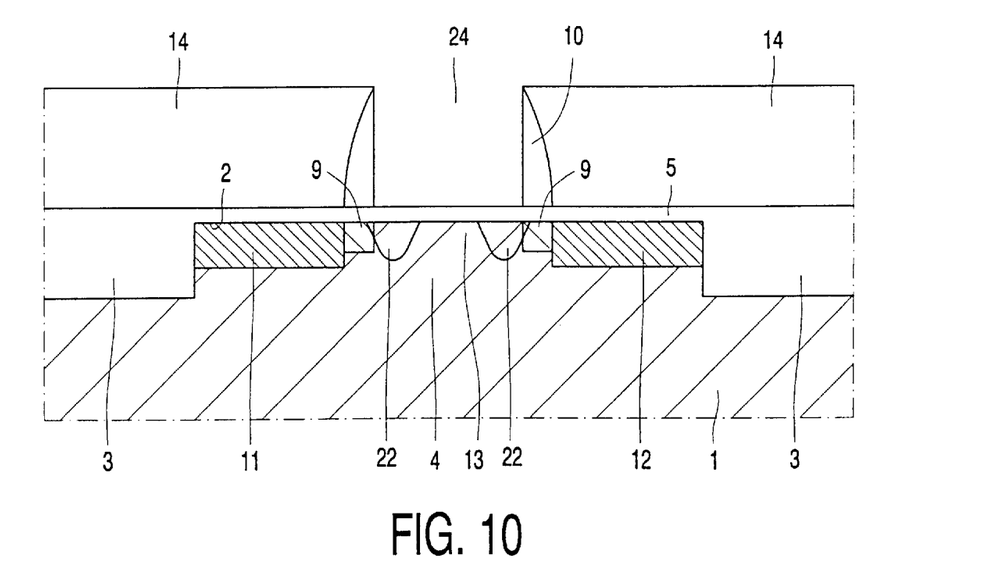

With reference to FIG. 10, the double-layer 20 and the additional layer 15 are removed. Removal of the additional layer 15, provided it is carried out in an isotropic way, may be sufficient to also remove the first sub-layer 18 and the second sub-layer 19 of the double-layer 20 by means of lift-off. The additional layer 15, in the present example composed of polycrystalline silicon, can be removed by means of wet etching using, for example, a hot KOH solution or by means of plasma etching using, for example, a CF$_4$/He/O$_2$ mixture. However, as in the present example the additional layer 15 and the second sub-layer 19 are composed of the same material, the second sub-layer 19 is etched simultaneously with the additional layer 15. In the above way, a further recess 24 is formed in the dielectric layer 14. The layer 5, in the present example composed of silicon oxide, can be kept in place, thereby providing a gate dielectric of the transistor. However, as the layer 5 may be contaminated, it is advantageous to remove it and replace it by a new insulating layer.

Figure 11:
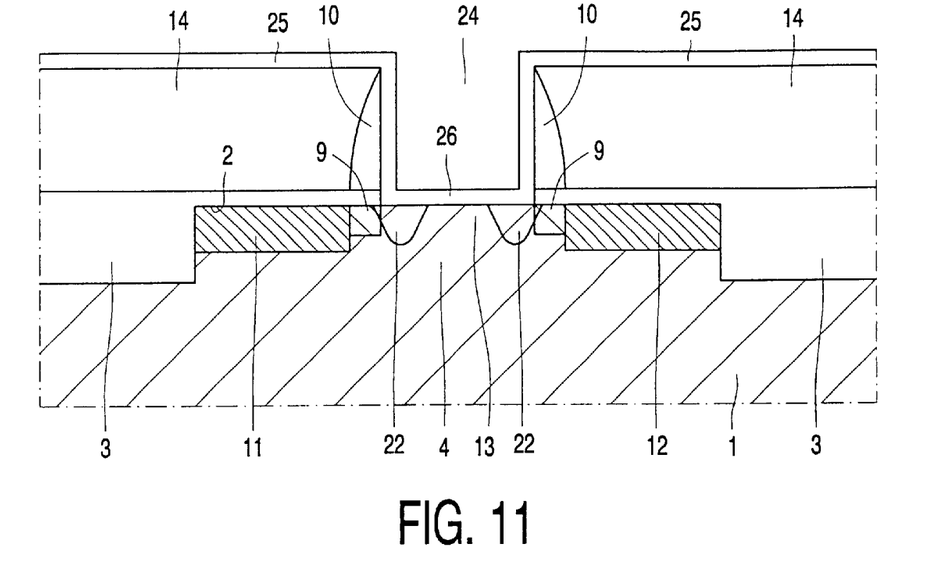

As shown in FIG. 11, an insulating layer 25 is applied forming the gate dielectric 26 of the transistor. The insulating layer 25 may be composed of silicon oxide, however, a dielectric material with a dielectric constant higher than that of silicon oxide, such as tantalum oxide, aluminum oxide or silicon nitride may be more favorable. If silicon oxide is to be applied for the gate dielectric 26, it may be obtained by means of, for example, chemical vapor deposition or thermal oxidation of silicon. The high dielectric constant materials tantalum oxide, aluminum oxide and silicon nitride can be applied, for example, by means of chemical vapor deposition (CVD).

Figure 12:
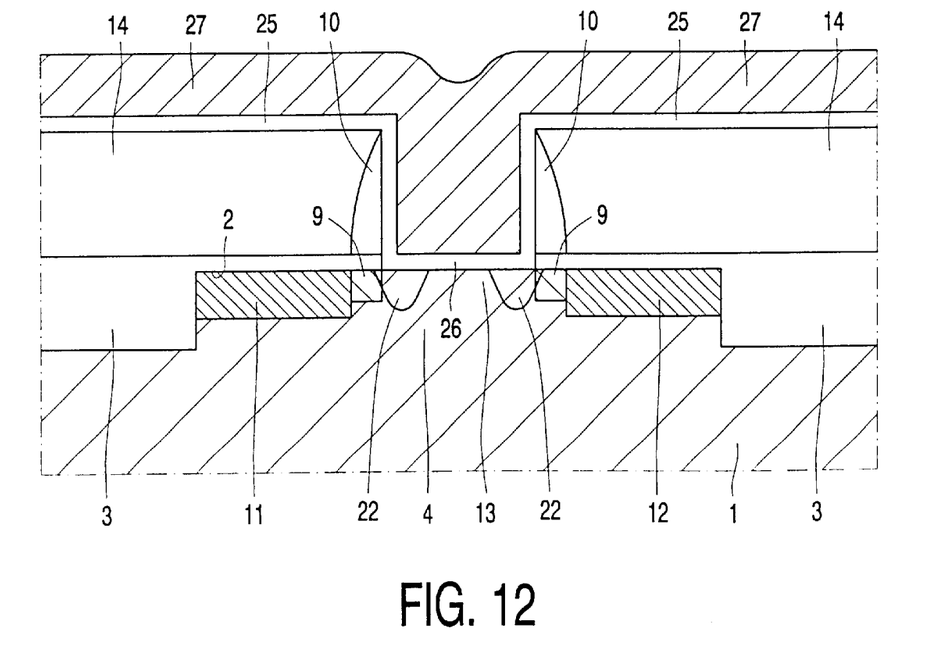

With reference to FIG. 12, a conductive layer 27 is applied in a usual way, thereby filling the further recess 24 with gate material. Although polycrystalline silicon or possibly amorphous silicon or Si$_x$Ge$_{1-x}$ can be used, the conductive layer 27 advantageously comprises a metal such as aluminum, tungsten, copper or molybdenum, or a combination of metals. It is to be noted that the conductive layer 27 is then advantageously applied as a double-layer consisting of a layer comprising a metal such as aluminum, tungsten, copper or molybdenum, or a combination of metals on top of a layer acting as an adhesion layer and/or barrier layer. In this respect Ti may be applied as the adhesion layer and TiN or TiW as the barrier layer.

Figure 13:
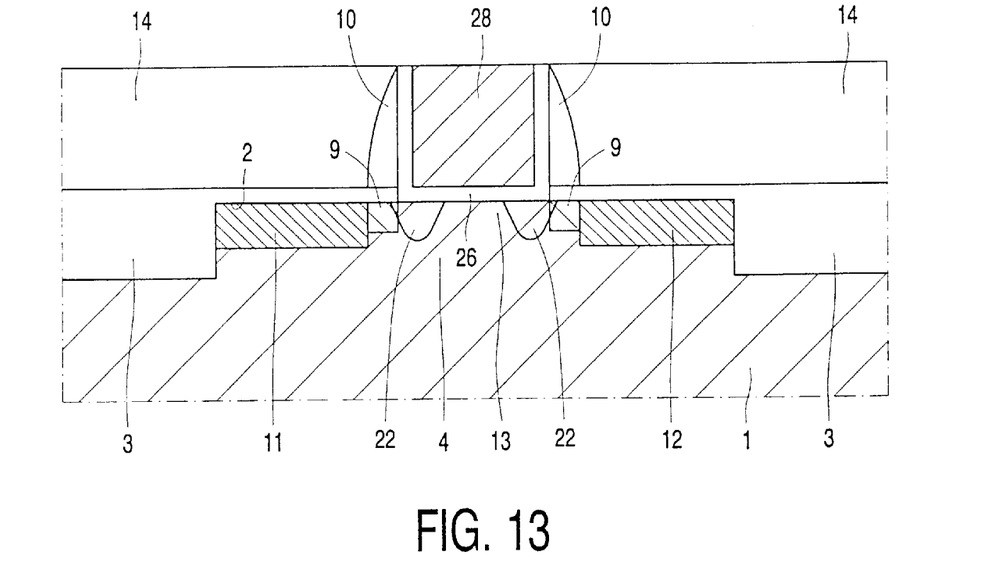

In a next step (FIG. 13), the conductive layer 27 is shaped into a gate 28 of the transistor. This can be done by means of, for example, etching using an oversized mask. In that case, the conductive material of the gate 28 stretches out over the dielectric layer 14, which is coated with the insulating layer 25, to beyond the further recess 24 shown in FIG. 10. However, it is advantageous to remove the conductive layer 27 in a maskless process until the insulating layer 25 is exposed, thereby forming the gate 28 which is recessed in the dielectric layer 14. An additional maskless removal of the insulating layer 25, the result of which is shown in FIG. 13, is not required, but can be beneficial in case the insulating layer 25 includes a high dielectric constant material. Maskless removal of either the conductive layer 27 or both the conductive layer 27 and the insulating layer 25 can be accomplished by means of, for example, chemical-mechanical polishing (CMP) e.g. using a commercially available slurry.

Finally, the. semiconductor device may be completed by conventional CMOS process flow steps (not shown) for oxide deposition, contact definition and metallization with one or more metal layers.

FIGS. 14 to 20 show in diagrammatic cross-sectional views successive stages in the manufacture of a semiconductor device, using a second embodiment of the method in accordance with the invention.

Figure 14:
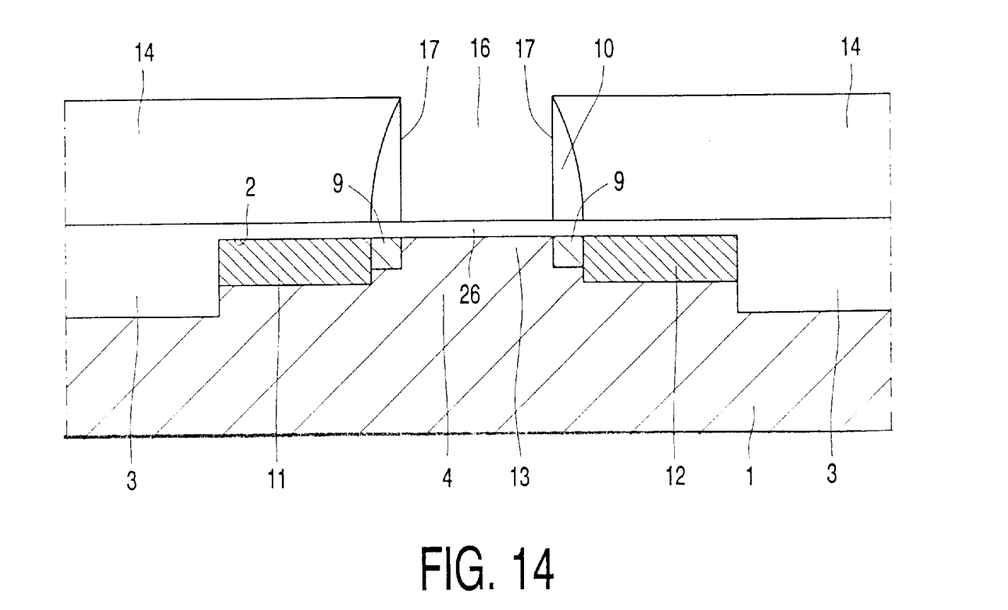
FIGS. 14 to 20 show in diagrammatic cross-sectional views successive stages in the manufacture of a semiconductor device, using a second embodiment of the method in accordance with the invention.

The situation shown in FIG. 14 is obtained by carrying out a process which is similar to that described with reference to FIGS. 1 to 5, except that in the present example a p-channel MOS transistor is manufactured instead of an n-channel MOS transistor. Hence, the low-doped semiconductor body 1 of the first conductivity type, in the present example a silicon body of, for example, an n-type conductivity of, for example, $1.10^{15}$ cm$^{-3}$ is provided at the surface 2 with the extended source zone 11,9 and the extended drain zone 12,9 of the second, opposite conductivity type, in the present example p-type conductivity. The layer 5, which is composed of, for example, silicon oxide, is kept in place in the present example in order to provide the gate dielectric 26 of the transistor (see FIG. 14). Alternatively, in this stage of the process the layer 5 may be removed by means of a dip-etch using HF and replaced with a new insulating layer providing the gate dielectric of the transistor. FIG. 14 shows a recess 16, which is aligned to the extended source zone 11,9 and the extended drain zone 12,9 and has side walls 17 extending substantially perpendicularly to the surface 2 of the semiconductor body 1. The side walls 17 of the recess 16 are thus provided by the side wall spacers 10.

Figure 15:
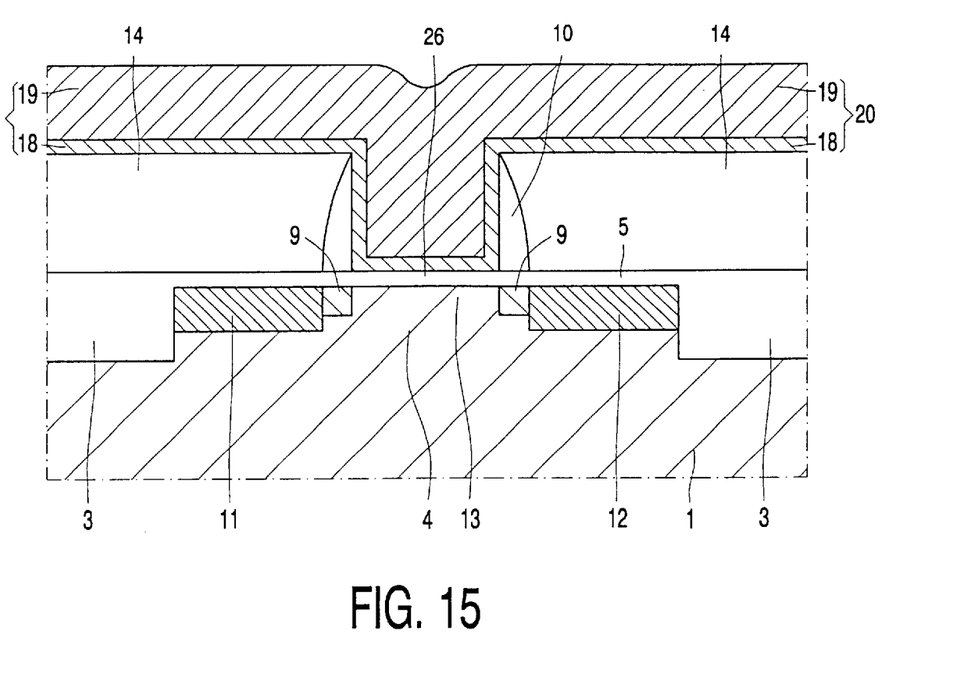
Figure 16:
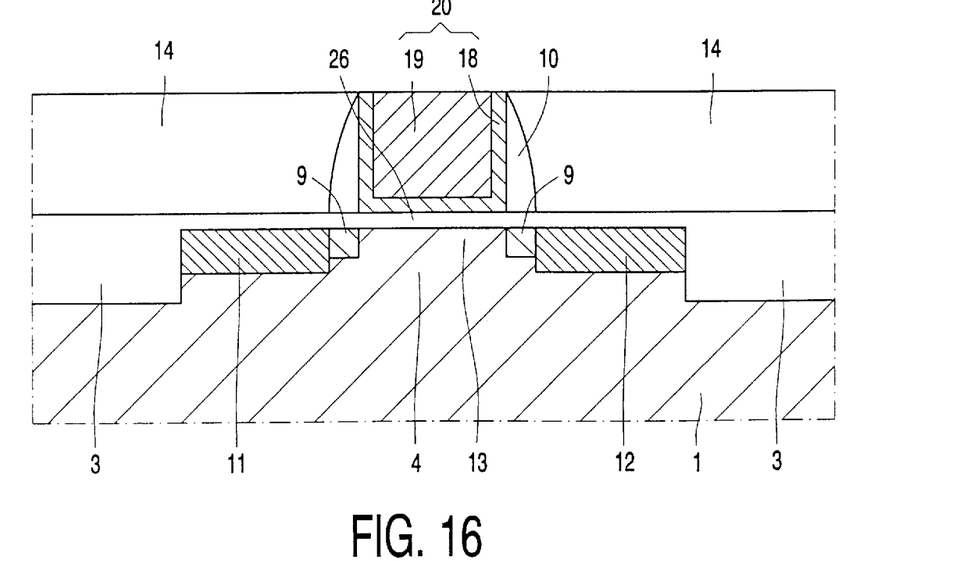

With reference to FIG. 15, the double-layer 20 is applied in a usual way, the double-layer 20 consisting of the second sub-layer 19 on top of the first sub-layer 18. In the present example, the first sub-layer 18 is composed of a polycrystalline silicon germanium alloy Si$_x$Ge$_{1-x}$ doped with boron, with x representing the fraction of silicon lying in the range between 0 and 1, whereas the second sub-layer 19 is composed of polycrystalline silicon.

The materials of the first sub-layer 18, the second sub-layer 19, and the side wall spacers 10 are chosen such that the first sub-layer 18 can be selectively etched with respect to the second sub-layer 19 and the side wall spacers 10 which are composed of silicon oxide in the present example. It will be clear that other combinations of materials can be used as well. By way of example, the second sub-layer 19 is composed of, for example, silicon nitride, and the side wall spacers 10 are composed of, for example, silicon oxide, whereas the first sub-layer 18 is composed of, for example, aluminum.

In a next step (FIG. 16), the second sub-layer 19 is removed over part of its thickness, in a maskless process, until the first sub-layer 18 is exposed, which first sub-layer 18 is also removed in a maskless process, thereby exposing the dielectric layer 14. The maskless removal of these layers can be accomplished by means of, for example, chemical-mechanical polishing (CMP) e.g. using a commercially available slurry. It should be noted, however, that maskless removal of the first sub-layer 18 is not required in this stage of the process, as this layer will be removed in a later stage of the process (see FIG. 17) anyhow.

Figure 17:
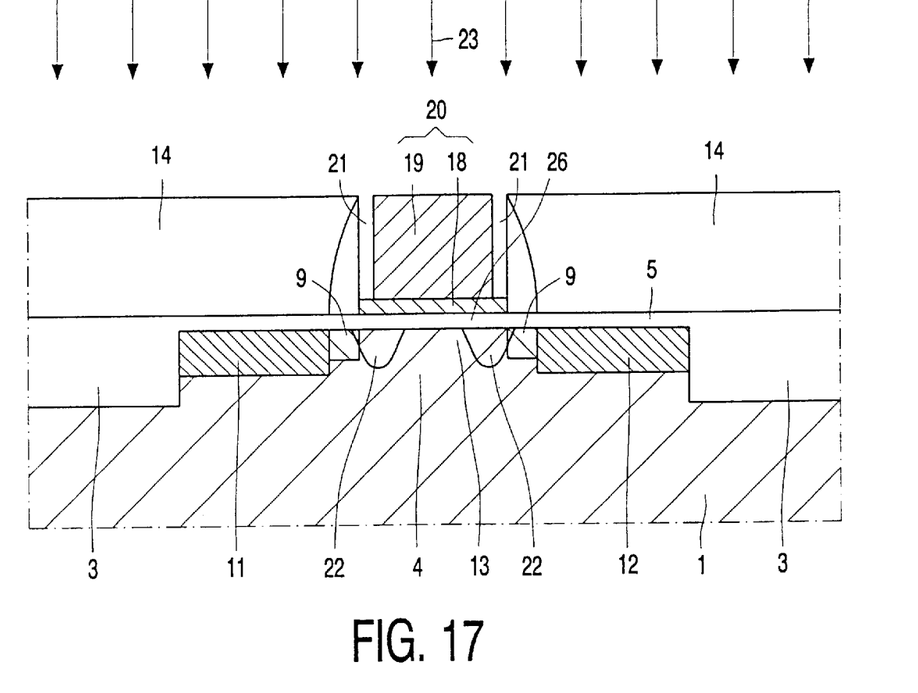

With reference to FIG. 17, the first sub-layer, in the present example composed of a polycrystalline silicon germanium alloy $Si_xGe_{1-x}$, is selectively etched with respect to the second sub-layer 19, which is composed of polycrystalline silicon in the present example, and with respect to the side wall spacers 10, which are composed of silicon oxide in the present example. This can be accomplished by means of anisotropic plasma etching using a HBr/HCl mixture or by means of wet etching using a $HNO_3:H_2O:dHF(0.08\%HF)$ mixture in a ratio of, for example, 35:20:10. As a result of selectively etching the first sub-layer 18 to a certain depth, the trenches 21 are formed, which trenches 21 extend substantially perpendicularly to the surface 2 of the semiconductor body 1. In a next step, the semiconductor body 1 is provided with the pocket implants 22 of the first conductivity type, in the present example n-type conductivity, by introducing n-type impurities such as, for example, antimony (Sb) or arsenic (As) via the trenches 21 into the semiconductor body 1 in a self-registered way. The introduction of the n-type impurities is advantageously carried out by means of ion implantation, as depicted by the arrows 23, which ion implantation is accompanied by, for example, a rapid thermal anneal (RTA) treatment at, for example, about 900° C. for, for example, about 10 seconds in order to activate the as-implanted impurities. In this respect, antimony may be implanted at an energy lying in the range of about 6.5 to 155 keV and in a dose of about $5.10^{13}$ atoms/cm$^2$, whereas arsenic may be implanted at an energy lying in the range of about 6 to 110 keV and in a dose of about $5.10^{13}$ atoms/cm$^2$. It is understood by those skilled in the art, that boron (B) or indium (In) may be implanted in an n-channel MOS transistor for similar reasons. For example, boron may be implanted at an energy lying in the range of about 2 to 20 keV and in a dose of about $5.10^{13}$ atoms/cm$^2$, whereas indium may be implanted at an energy lying in the range of about 7 to 150 keV and in a dose of about $5.10^{13}$ atoms/cm$^2$. In order to allow extra channeling of the impurities along crystal directions and planes of the semiconductor body 1, the ion implantation is advantageously carried out substantially perpendicularly to the surface 2 of the semiconductor body 1.

It is to be noted that the impurities are introduced into the semiconductor body 1 via the trenches 21 after the formation of the source zone 11 and the drain zone 12 and, hence, after the high temperature anneal associated with the formation of the source zone and the drain zone. As a consequence, a redistribution of the impurities, which have been introduced via the trenches, is counteracted.

Figure 18:
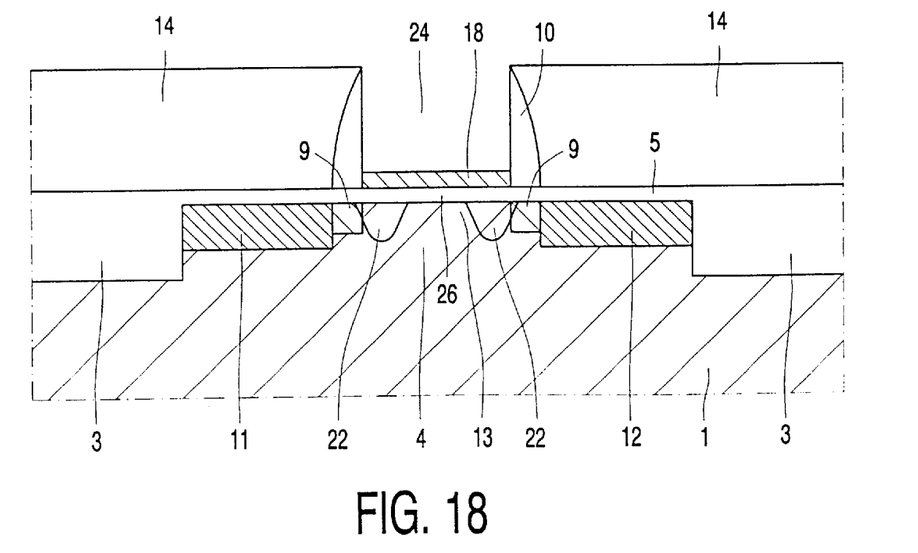

With reference to FIG. 18, the second sub-layer 19, in the present example composed of polycrystalline silicon, is removed. Selective removal of the second sub-layer 19 can be accomplished by means of wet etching using, for example, a hot KOH solution or by means of plasma etching using, for example, a $CF_4/He/O_2$ mixture. In this way, a further recess 24 is formed in the dielectric layer 14.

Figure 19:
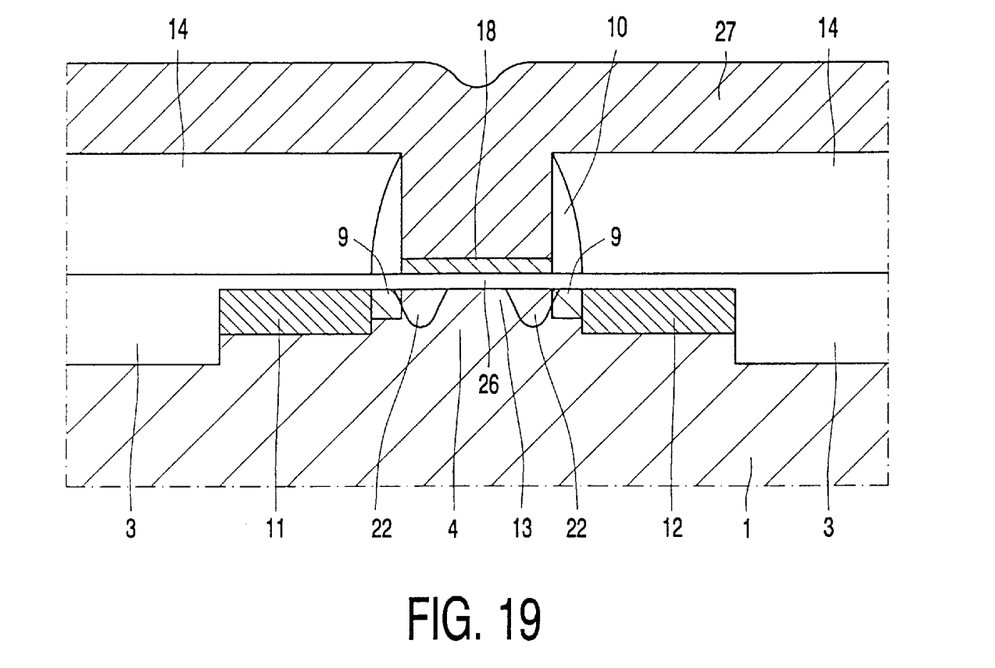
Figure 20:
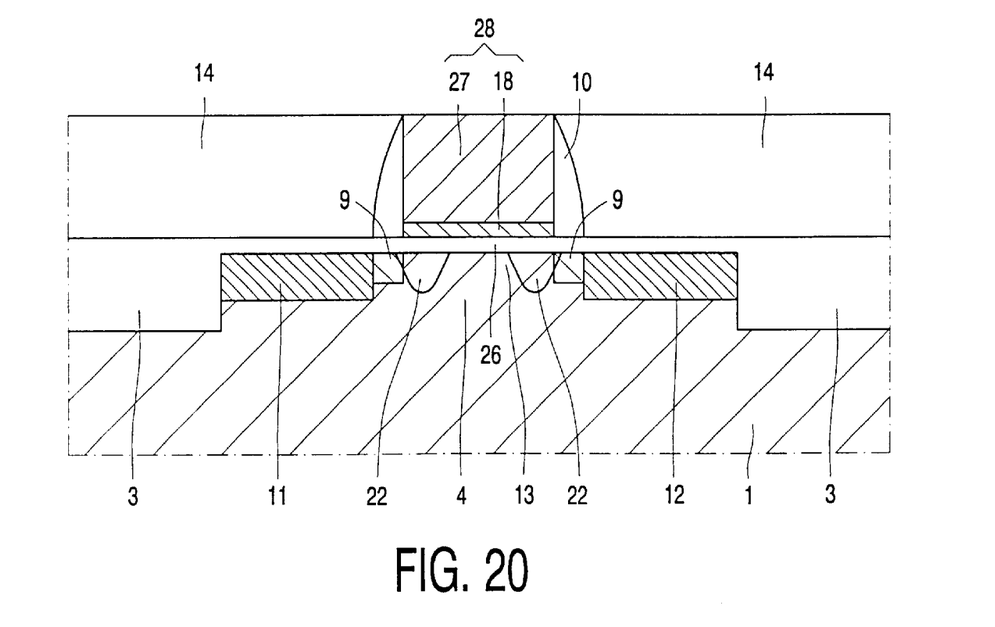

With reference to FIG. 19, the conductive layer 27 is applied in a usual way, thereby filling the further recess 24 with gate material. Although polycrystalline silicon or possibly amorphous silicon or $Si_xGe_{1-x}$ can be used, the conductive layer 27 advantageously comprises a metal such as aluminum, tungsten, copper or molybdenum, or a combination of metals. It is to be noted that the conductive layer 27 is then advantageously applied as a double-layer consisting of a layer comprising a metal such as aluminum, tungsten, copper or molybdenum, or a combination of metals, on top of a layer acting as an adhesion layer and/or barrier layer. In this respect Ti may be applied as the adhesion layer and TiN or TiW as the barrier layer.

In a next step (FIG. 20), the conductive layer 27 is shaped. This can be accomplished by means of, for example, etching using an oversized mask. In that case the conductive layer 27 stretches out over the dielectric layer 14 to beyond the further recess 24 shown in FIG. 18. However, it is advantageous to remove the conductive layer 27 in a maskless process until the dielectric layer 14 is exposed. This can be accomplished by means of, for example, chemical-mechanical polishing (CMP) e.g. using a commercially available slurry. The first sub-layer 18 and the conductive layer 27 jointly provide the gate 28 of the transistor, which gate 28 is recessed in the dielectric layer 14.

Finally, the semiconductor device may be completed by conventional CMOS process flow steps (not shown) for oxide deposition, contact definition and metallization with one or more metal layers.

The embodiments described above are based on the so-called replacement gate process, which is described inter alia in an article entitled "Sub-100 nm gate length metal gate NMOS transistors fabricated by a replacement gate process", written by Chatterjee et al. and published in IEDM 97 (1997), pp. 821–824.

It will be apparent that the invention is not limited to the embodiments described above, but that many variations are possible to those skilled in the art within the scope of the invention.

The additional layer may alternatively be applied as an insulating layer directly onto the surface of the semiconductor body, which insulating layer eventually provides the gate dielectric of the transistor. The additional layer should then be composed of a material which is applicable as a gate dielectric material and with respect to which the first sub-layer can be selectively removed. Similarly, in the absence of the additional layer, the first sub-layer may be applied as an insulating layer directly onto the surface of the semiconductor body, which insulating layer eventually provides the gate dielectric of the transistor. The first sub-layer should then be composed of a material which is applicable as a gate dielectric material and which can be selectively removed with respect to the second sub-layer and the side wall spacers.

After the formation of the pocket implants, the additional layer, the (remaining part of the) first sub-layer and the second sub-layer can also be kept in place in order to jointly provide the gate of the transistor, provided suitable materials are used for these layers. Similarly, in the absence of the additional layer, the (remaining part of the) first sub-layer and the second sub-layer can be kept in place in order to jointly provide the gate of the transistor.

The source zone and the drain zone of the transistor can optionally be implanted without extensions. In the embodiments described above the active region is formed by a surface region of the original semiconductor body. Alternatively, the active region may represent a conventional p or n well, which is obtained by means of locally doping the original semiconductor body in a region adjoining its surface with a doping concentration suitable for providing an n-channel or p-channel transistor.

What is claimed is:

1. A method of manufacturing a semiconductor device comprising a semiconductor body of a first conductivity type which is provided at a surface with a transistor having a gate insulated from a channel provided at the surface of the semiconductor body by a gate dielectric, wherein a structure is provided on the surface, which structure comprises a dielectric layer having a recess, which recess is aligned to a source zone and a drain zone of a second conductivity type provided at the surface of the semiconductor body and has side walls extending substantially perpendicularly to the surface of the semiconductor body, in which recess a double-layer is applied consisting of a first sub-layer covering the recess, and a second sub-layer formed on top of the first sub-layer, which second sub-layer is removed over part of its thickness until the first sub-layer is exposed, which first sub-layer is selectively etched with respect to the second sub-layer and the side walls of the recess to a depth, thereby forming trenches extending substantially perpendicularly to the surface of the semiconductor body, via which trenches impurities of the first conductivity type are introduced into the semiconductor body, thereby forming pocket implants.

2. A method as claimed in claim 1, wherein, after the formation of the pocket implants, at least the second sub-layer is removed, thereby providing a further recess, and a conductive layer is applied filling the further recess with gate material.

3. A method as claimed in claim 2, wherein, in order to provide the structure, a patterned layer is applied at the area of the planned gate, and the source zone and the drain zone of the second conductivity type are formed in the semiconductor body while using the patterned layer as a mask, after which the dielectric layer is provided in such a way, that the thickness of the dielectric layer next to the patterned layer is substantially equally large or larger than the height of the patterned layer, which dielectric layer is removed over part of its thickness by means of a material removing treatment until the patterned layer is exposed, after which the patterned layer is removed, and the recess is provided so as to be aligned to the source zone and the drain zone.

4. A method as claimed in claim 2, wherein, after the formation of the pocket implants, only the second sub-layer is removed while at least a part of the first sub-layer is left intact, and the conductive layer is applied upon the remaining part of the first sub-layer.

5. A method as claimed in claim 4, wherein the transistor is applied to the surface of the semiconductor body as a p-channel transistor, and a silicon germanium alloy is applied as the first sub-layer.

6. A method as claimed in claim 5, wherein silicon oxide is applied as the dielectric layer, and silicon is applied as the second sub-layer.

7. A method as claimed in claim 3, wherein, after the removal of the patterned layer, an additional layer is applied, which additional layer provides the side walls of the recess which is aligned to the source zone and the drain zone.

8. A method as claimed in claim 7, wherein silicon is applied as the additional layer and the second sub-layer, and a silicon germanium alloy is applied as the first sub-layer.

9. A method as claimed in claim 7, wherein the double-layer and the additional layer are removed after the formation of the pocket implants, and the gate dielectric is provided at the surface of the semiconductor body, after which the conductive layer is applied.

10. A method as claimed in claim 1, wherein the impurities are introduced into the semiconductor body by means of ion implantation.

11. A method as claimed in claim 10, wherein the ion implantation is carried out substantially perpendicularly to the surface of the semiconductor body.

12. A method as claimed in claim 1, wherein the transistor is applied to the surface of the semiconductor body as an n-channel transistor having pocket implants formed by the introduction of boron or indium.

13. A method as claimed in claim 1, wherein the transistor is applied to the surface of the semiconductor body as a p-channel transistor having pocket implants formed by the introduction of antimony or arsenic.

14. A method as claimed in claim 2, wherein a layer comprising a metal is applied as the conductive layer.

15. A method as claimed in claim 14, wherein the layer comprising the metal is applied as a double-layer consisting of a layer comprising the metal on top of a layer acting as an adhesion and/or barrier layer.

16. A method as claimed in claim 14, wherein the metal is selected from the group comprising aluminum, tungsten, copper and molybdenum.

* * * * *